(12) United States Patent
Wang et al.

(10) Patent No.: US 9,252,114 B2
(45) Date of Patent: Feb. 2, 2016

(54) SEMICONDUCTOR DEVICE GRID ARRAY PACKAGE

(71) Applicants: Zhijie Wang, Tianjin (CN); Zhigang Bai, Tianjin (CN); Aipeng Shu, Tianjin (CN); Yanbo Xu, Tianjin (CN); Huchang Zhang, Tianjin (CN); Fei Zong, Tianjin (CN)

(72) Inventors: Zhijie Wang, Tianjin (CN); Zhigang Bai, Tianjin (CN); Aipeng Shu, Tianjin (CN); Yanbo Xu, Tianjin (CN); Huchang Zhang, Tianjin (CN); Fei Zong, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/551,070

(22) Filed: Nov. 23, 2014

(65) Prior Publication Data

US 2015/0243623 A1 Aug. 27, 2015

(30) Foreign Application Priority Data

Feb. 27, 2014 (CN) .......................... 2014 1 0137295

(51) Int. Cl.
*H01L 23/04* (2006.01)
*H01L 23/00* (2006.01)
*H01L 23/31* (2006.01)

(52) U.S. Cl.
CPC ............ *H01L 24/17* (2013.01); *H01L 23/3128* (2013.01); *H01L 24/11* (2013.01); *H01L 24/85* (2013.01); *H01L 24/48* (2013.01); *H01L 24/49* (2013.01); *H01L 24/97* (2013.01); *H01L 2224/16225* (2013.01); *H01L 2224/32225* (2013.01); *H01L 2224/48091* (2013.01); *H01L 2224/48227* (2013.01); *H01L 2224/49171* (2013.01); *H01L 2224/73265* (2013.01); *H01L 2224/85* (2013.01); *H01L 2224/85401* (2013.01); *H01L 2224/92247* (2013.01); *H01L 2924/00014* (2013.01); *H01L 2924/15173* (2013.01); *H01L 2924/181* (2013.01)

(58) Field of Classification Search
CPC ..... H01L 24/17; H01L 23/3128; H01L 24/11; H01L 24/85
USPC ........................................................ 257/698
See application file for complete search history.

(56) References Cited

U.S. PATENT DOCUMENTS

| 5,450,283 | A | 9/1995 | Lin et al. |
|---|---|---|---|
| 5,969,426 | A | 10/1999 | Baba et al. |
| 6,118,183 | A | 9/2000 | Umehara et al. |
| 7,071,027 | B2 * | 7/2006 | Seo ...................... H05K 1/0271 257/E23.069 |
| 7,498,196 | B2 | 3/2009 | Lee et al. |
| 8,035,213 | B2 * | 10/2011 | Lee ................... H01L 23/49816 257/686 |
| 8,536,684 | B2 | 9/2013 | Chen et al. |
| 2007/0224779 | A1 | 9/2007 | Park |
| 2012/0146216 | A1 | 6/2012 | Kang et al. |
| 2012/0175761 | A1 | 7/2012 | Zenbutsu |

* cited by examiner

*Primary Examiner* — Luan C Thai
(74) *Attorney, Agent, or Firm* — Charles E. Bergere (57) ABSTRACT

A grid array assembly is formed from an electrical insulating material with embedded solder deposits. A first portion of each of the solder deposits is exposed on a first surface of the insulating material and a second portion of each of the solder deposits is exposed on an opposite surface of the insulating material. A semiconductor die is mounted to the first surface of the insulating material and electrodes of the die are connected to the solder deposits with bond wires. The die, bond wires, and the first surface of the insulating material then are covered with a protective encapsulating material.

16 Claims, 8 Drawing Sheets

SEMICONDUCTOR DEVICE GRID ARRAY PACKAGE

BACKGROUND OF THE INVENTION

The present invention relates generally to semiconductor device packaging and, more particularly, to a semiconductor device ball grid array package.

Packaged semiconductors provide external electrical connections and physical protection for packaged dies. Continued progress in reduction of the size of semiconductor dies, and increased functionality of the integrated circuits formed on the dies, increases external connectivity complexity of such packaged semiconductors.

One typical type of packaged semiconductor is a Quad Flat Pack (QFP) package formed with a semiconductor die mounted to a lead frame. The lead frame is formed from a sheet of metal that comprises a die attach pad or flag and tie bars that attach the flag to a frame. Leads of the lead frame are electrically connected to electrodes of the die with bond wires. After wire bonding, the semiconductor die and leads are encapsulated in a compound (material) such as a plastic material leaving only sections of the leads exposed. These exposed sections of the leads are cut from the frame of the lead frame (singulated) and bent for ease of connection to a circuit board. However, the inherent structure of QFP packages results in limiting the number of leads, and therefore the number of package external electrical connections, that can be used for a specific package size. Further, the external electrical connections of the lead frame based grid array packages are typically fabricated from a thin single sheet of conductive material, such as copper or aluminium, and these connections may not be sufficiently held within the encapsulating compound (material) and may become lose.

Grid array packages have been developed as an alternative to QFP packages. Grid array packages increase the number of external electrical connections while maintaining or even decreasing the package size. Such grid array packages include Pin Grid Arrays (PGA), Ball Grid Array (BGA) and Land Grid Arrays (LGA). The fabrication of such grid array packages requires a substrate upon which a semiconductor die is mounted. The substrate has conductive traces and vias to which protruding solder deposits are mounted, typically solder balls. However, the inherent thickness of such substrates adds to the overall size of current grid array packages. This is undesirable in view of the trend towards miniaturisation of electronic devices that include semiconductor die grid array packages.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a method of assembling a semiconductor die grid array package. The method includes providing a grid array assembly formed from an electrical insulating material with solder deposits embedded therein. A first portion of each of the solder deposits is exposed on a first surface of the insulating material and a second portion of each of the solder deposits is exposed on an opposite surface of the insulating material. A semiconductor die is mounted to the first surface of the insulating material. Electrodes of the semiconductor die then are electrically connected to the solder deposits. The die and the first surface of the insulating material then are covered with an encapsulating material.

In another embodiment, the present invention provides a semiconductor die grid array package. The grid array package includes a grid array assembly formed from an electrical insulating material with solder deposits embedded therein. A first portion of each of the solder deposits is exposed on a first surface of the insulating material and a second portion of each of the solder deposits is exposed on an opposite second surface of the insulating material. A semiconductor die is mounted to the first surface of the insulating material. The semiconductor die has electrodes that are electrically connected to the solder deposits. An encapsulating material covers the semiconductor die and the first surface of the insulating material.

In yet another embodiment, the present invention provides a grid array assembly formed from an electrical insulating material with solder deposits embedded therein. A first portion of each of the solder deposits is exposed on a first surface of the insulating material, and a second portion of each of the solder deposits is exposed on an opposing surface of the insulating material. Either or both of the first and second portions may protrude from the insulating material and also may have a deformed surface.

Figure 1:
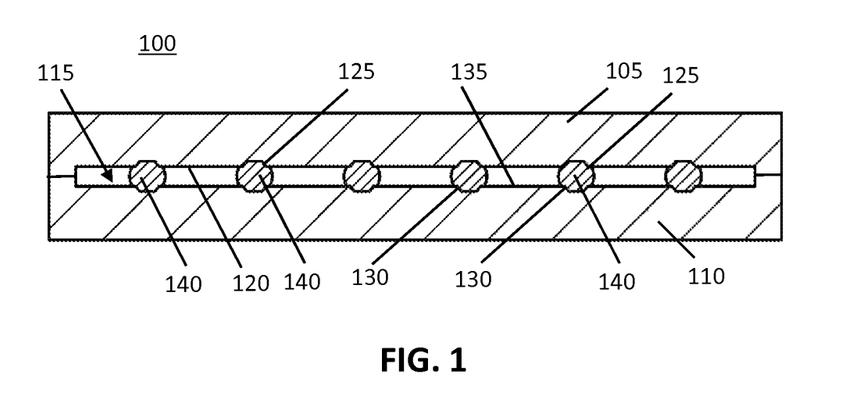
FIG. 1 is a cross-sectional side view of a two-part mold, according to a first preferred embodiment of the present invention.

Referring now to FIG. 1, a cross-sectional side view of a two-part mold 100 according to a first preferred embodiment of the present invention is shown. The mold 100 has an upper body 105 and a lower body 110 that abut each other to form a molding cavity 115. An upper surface 120 of the molding cavity 115 has an upper solder deposit locator array formed by upper recesses 125 that are aligned with lower recesses 130 on a lower surface 135 of the molding cavity 115.

As illustrated, solder deposits in the form of solder balls 140 are located in the recesses 125, 130. In this particular embodiment the solder balls 140 are initially deposited in the lower recesses 130. When the upper body 105 and lower body 110 are brought together into an abutting engagement, thus forming the molding cavity 115, the shape of the recesses 125, 130 deform the solder balls 140 as shown.

Figure 2:
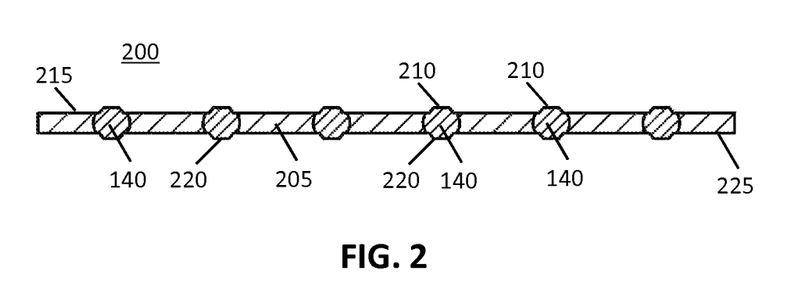
FIG. 2 is a cross-sectional side view of a grid array assembly, according to a first preferred embodiment of the present invention.

FIG. 2 is a cross-sectional side view of a grid array assembly 200 according to a first preferred embodiment of the present invention. The grid array assembly 200 is formed after a mold compound, which is an electrical insulating material 205, has been molded around the solder balls 140. More specifically, grid array assembly 200 is formed after the electrical insulating material 205, in a heated fluid state, has been transferred or injected into the molding cavity 115 and then cooled as will be apparent to a person skilled in the art.

As shown, the solder balls 140 are embedded in the electrical insulating material 205. Also, a first portion 210 of each of the solder balls 140 is exposed on a first surface 215 of the insulating material 205. Similarly, a second portion 220 of each of the solder balls 140 is exposed on an opposite second surface 225 of the insulating material 205.

Figure 3:
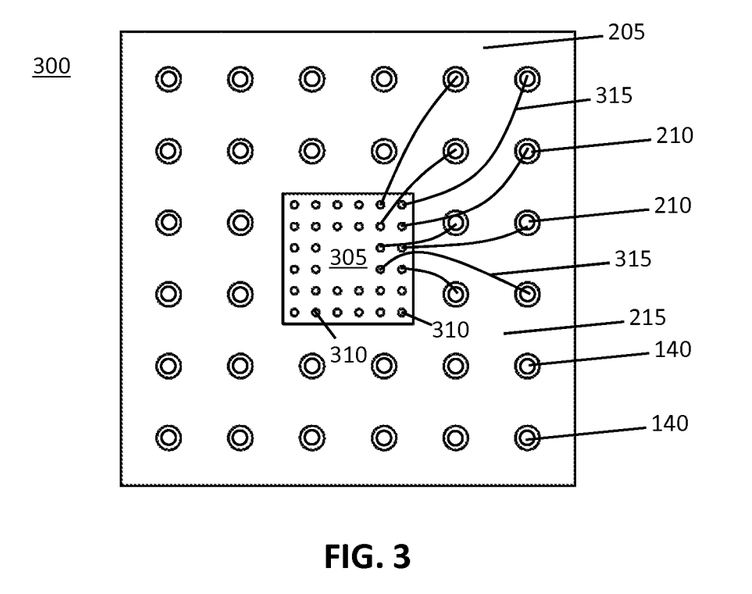
FIG. 3 is a plan view of a semiconductor die assembly, formed from the grid array assembly of FIG. 2, according to a first preferred embodiment of the present invention.

FIG. 3 is a plan view of a semiconductor die assembly 300, formed from the grid array assembly 200, according to a first preferred embodiment of the present invention. The semiconductor die assembly 300 includes a semiconductor die 305 mounted to the first surface 215 of the electrical insulating material 205. The semiconductor die 305 has a plurality of electrodes 310 that are selectively electrically connected to the solder balls 140 by bond wires 315.

Figure 4:
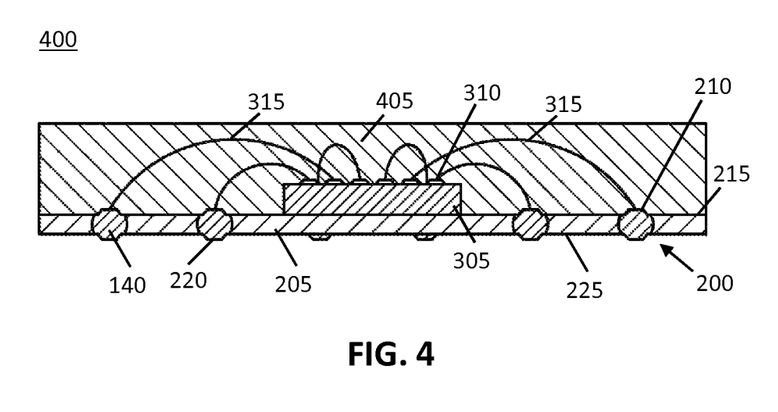
FIG. 4 is a cross-sectional side view of a semiconductor die grid array package, formed from the semiconductor die assembly of FIG. 3, according to a first preferred embodiment of the present invention.

FIG. 4 is a cross-sectional side view of semiconductor die grid array package 400, formed from the semiconductor die assembly 300, according to a first preferred embodiment of the present invention. The semiconductor die grid array package 400 includes an encapsulating material 405 that covers the semiconductor die 305, bond wires 315 and the first surface 215 of the electric insulating material 205. As will be apparent to a person skilled in the art, the encapsulating material 405 is typically a mold compound molded to the semiconductor die 305 and insulating material 205. Also, for suitable mounting of the package 400 to a circuit board, the second portion 220 of each of the solder balls 140 protrude from the second surface 225 of the electrical insulating material 205.

Figure 5:
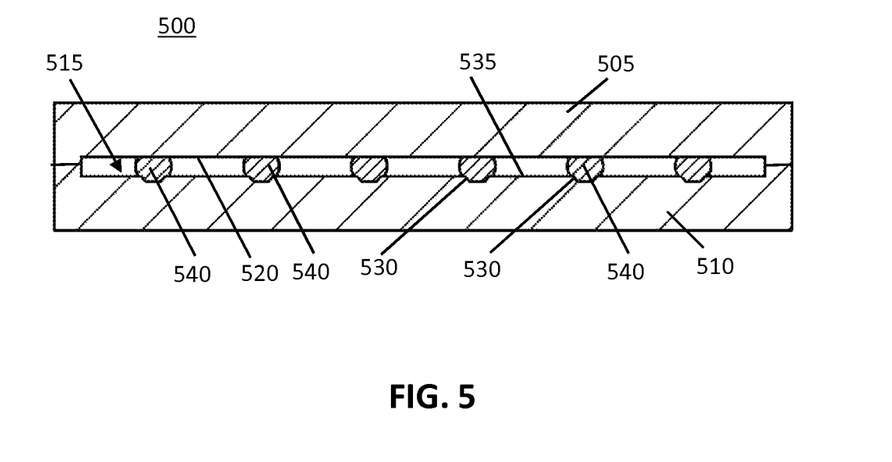
FIG. 5 is a cross-sectional side view of a two-part mold, according to a second preferred embodiment of the present invention.

FIG. 5 is a cross-sectional side view of a two-part mold 500, according to a second preferred embodiment of the present invention. The mold 500 has an upper body 505 and a lower body 510 that abut each other to form a molding cavity 515. The molding cavity 515 has a planar upper surface 520 and there are recesses 530 on a lower surface 535 of the molding cavity 515.

As illustrated, there are solder deposits in the form of solder balls 540 located in the recesses 530. In this particular embodiment the solder balls 540 are initially deposited in the recesses 530. When the upper body 505 and lower body 510 are brought together into an abutting engagement, thus forming the molding cavity 515, the shape of the recesses 530 and planar upper surface 520 deform the solder balls 540 as shown.

Figure 6:
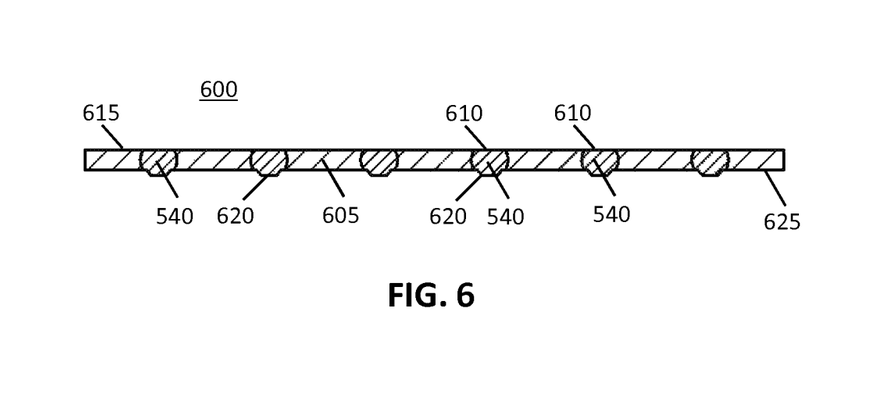
FIG. 6 is a cross-sectional side view of a grid array assembly, according to a second preferred embodiment of the present invention.

FIG. 6 is a cross-sectional side view of a grid array assembly 600, according to a second preferred embodiment of the present invention. The grid array assembly 600 is formed after a mold compound, which is an electrical insulating material 605, has been molded around the solder balls 540. More specifically, grid array assembly 600 is formed after the electrical insulating material 605, in a heated fluid state, has been transferred or injected into the molding cavity 515 and then cooled as will be apparent to a person skilled in the art.

As shown, the solder balls 540 are embedded in the electrical insulating material 605. Also, a first portion 610 of each of the solder balls 540 is exposed on a first surface 615 of the insulating material 605. Similarly, a second portion 620 of each of the solder balls 540 is exposed on an opposite second surface 625 of the insulating material 205.

Figure 7:
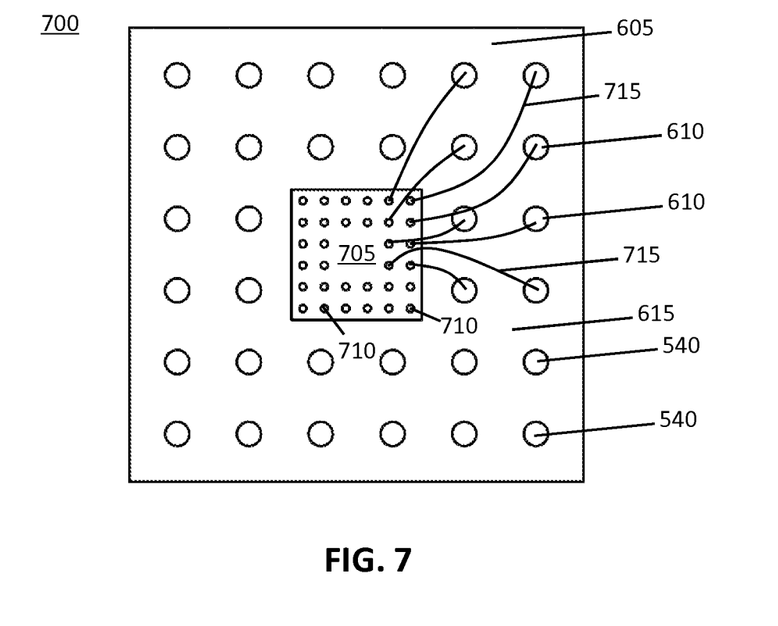
FIG. 7 is a plan view of a semiconductor die assembly, formed from the grid array assembly of FIG. 6, according to a second preferred embodiment of the present invention

FIG. 7 is a plan view of a semiconductor die assembly 700, formed from the grid array assembly 600, according to a second preferred embodiment of the present invention. The semiconductor die assembly 700 includes a semiconductor die 705 mounted to the first surface 615 of the electrical insulating material 605. The semiconductor die 705 has a plurality of electrodes 710 that are selectively electrically connected to the solder balls 540 by bond wires 715.

Figure 8:
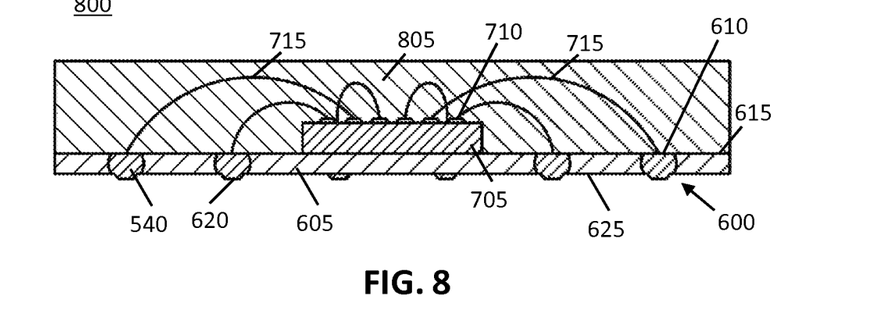
FIG. 8 is a cross-sectional side view of a semiconductor die grid array package, formed from the semiconductor die assembly of FIG. 7, according to a second preferred embodiment of the present invention.

FIG. 8 is a cross-sectional side view of semiconductor die grid array package 800, formed from the semiconductor die assembly 700, according to a second preferred embodiment of the present invention. The semiconductor die grid array package 800 includes an encapsulating material 805 that covers the semiconductor die 705, bond wires 715 and the first surface 615 of the insulating material 605. As will be apparent to a person skilled in the art, the encapsulating material 805 is typically a mold compound molded to the semiconductor die 705 and insulating material 605. Also, for suitable mounting of the package 800 to a circuit board, the second portion 620 of each of the solder balls 540 protrude from the second surface 625 of the electrical insulating material 605.

Figure 9:
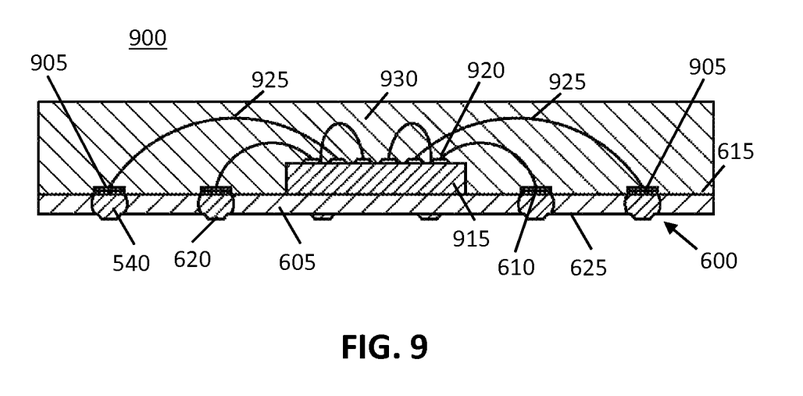
FIG. 9 is a cross-sectional side view of a semiconductor die grid array package, formed from the grid array assembly of FIG. 6, according to a third preferred embodiment of the present invention.

FIG. 9 is a cross-sectional side view of semiconductor die grid array package 900, formed from the grid array assembly 600, according to a third preferred embodiment of the present invention. In this embodiment conductive plating regions form a bond pad 905 deposited onto the first portion 610 of each of the solder balls 540. The plating regions typically comprise a Nickel and Gold alloy that has been deposited on each of the first portions 610 by a dry plating process. A semiconductor die 915 is mounted to the first surface 615 of the insulating material 605. A plurality of electrodes 920 of the die 915 are selectively electrically connected to the solder balls 540 by bond wires 925. More specifically, the bond wires 925 are selectively bonded to a respective one of the bond pads 905. Furthermore, for suitable mounting of the package 900 to a circuit board, the second portion 620 of each of the solder balls 540 protrude from the second surface 625 of the electrical insulating material 605.

The semiconductor die grid array package 900 also includes an encapsulating material 930 that covers the semiconductor die 915, bond wires 925 and the first surface 615 of the insulating material 605. As will be apparent to a person skilled in the art, the encapsulating material 930 is typically a mold compound molded to the semiconductor die 915 and insulating material 605.

Figure 10:
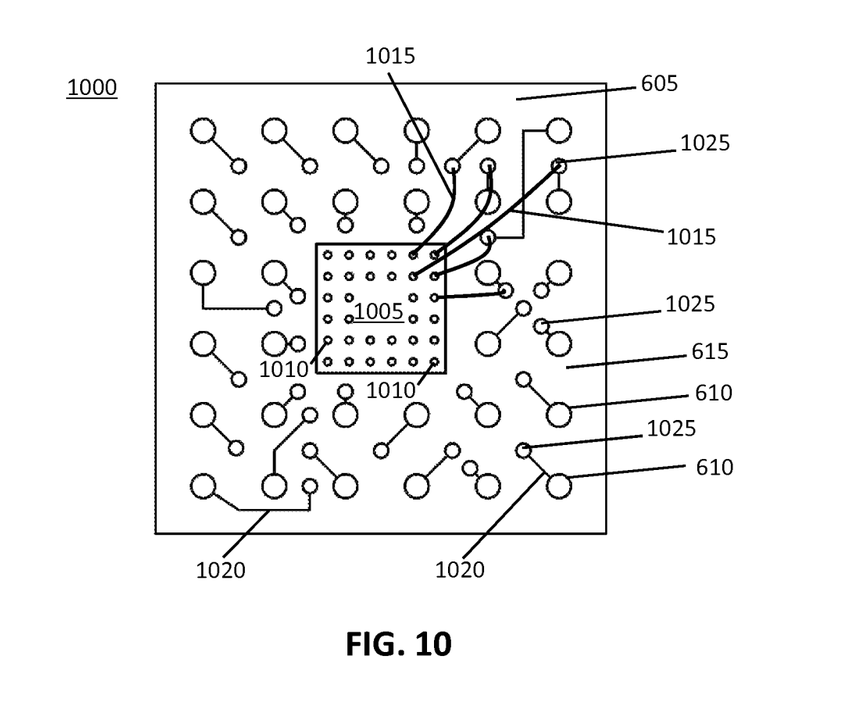
FIG. 10 is a plan view of a semiconductor die assembly, formed from the grid array assembly of FIG. 6, according to a fourth preferred embodiment of the present invention.

FIG. 10 is a plan view of a semiconductor die assembly 1000, formed from the grid array assembly 600, according to a fourth preferred embodiment of the present invention. The semiconductor die assembly 1000 includes a semiconductor die 1005 mounted to the first surface 615 of the electrical insulating material 605. The semiconductor die 1005 has a plurality of electrodes 1010 that are selectively electrically connected to the solder balls 540 by bond pads 1025, conductive traces 1020 and bond wires 1015. In this embodiment conductive plating regions form the conductive traces 1020 and a portion of each of the runners 1020 is deposited onto the first portion 610 of each of the solder balls 540 and the reminder of each of the runners 1020 is deposited onto the first surface 615 of the electrical insulating material 605. The runners 1020 typically comprise a Nickel and Gold alloy that has been deposited by a dry plating process. Furthermore, the electrically connecting of the electrodes 1010 to the solder balls 540 is provided by the bond wires 1015 being bonded at the bond pads 1025 of the conductive traces 1020.

Figure 11:
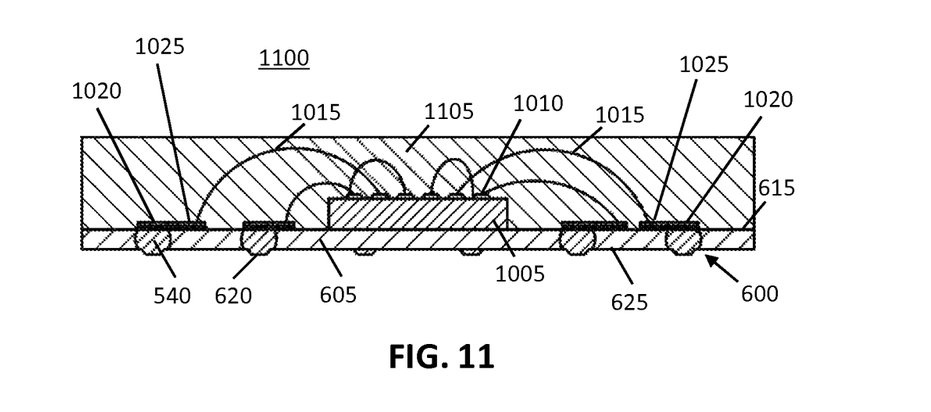
FIG. 11 is a cross-sectional side view of a semiconductor die grid array package, formed from the semiconductor die assembly of FIG. 10, according to a fourth preferred embodiment of the present invention.

FIG. 11 is a cross-sectional side view of a semiconductor die grid array package 1100, formed from the semiconductor die assembly 1000, according to a fourth preferred embodiment of the present invention. The semiconductor die grid array package 1100 includes an encapsulating material 1105 that covers the semiconductor die 1005, bond wires 1015 and the first surface 615 of the insulating material 605. As will be apparent to a person skilled in the art, the encapsulating material 1105 is typically a mold compound molded to the semiconductor die 1005 and electrical insulating material 605. A plurality of electrodes 1010 of the die 1005 are selectively electrically connected to the solder balls 540 by bond wires 1015. More specifically, the bond wires 1015 are selectively bonded to a respective one of the bond pads 1025. Furthermore, for suitable mounting of the package 1100 to a circuit board, the second portion 620 of each of the solder balls 540 protrude from the second surface 625 of the electrical insulating material 605.

Figure 12:
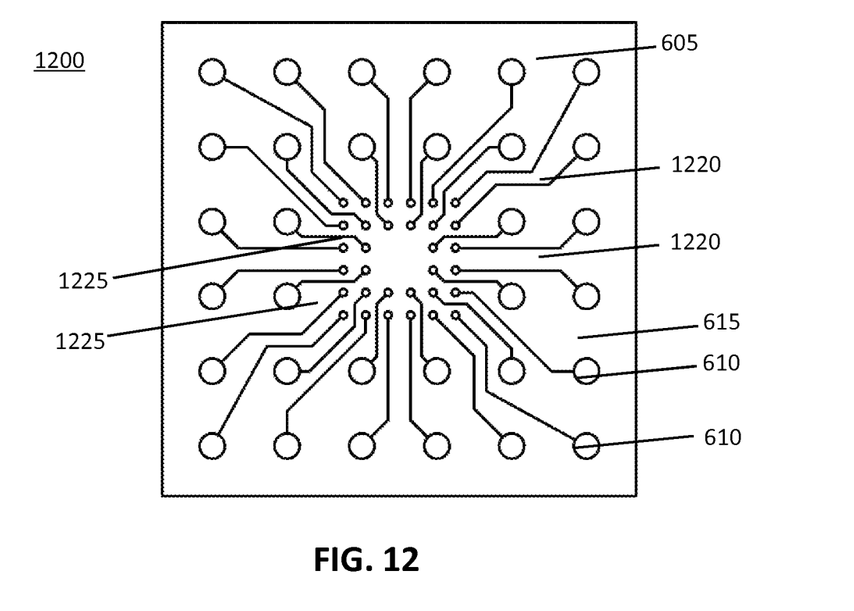
FIG. 12 is a plan view of a flip-chip grid array assembly, formed from the grid array assembly of FIG. 6, according to a fifth preferred embodiment of the present invention.

Referring to FIG. 12, a plan view of a flip-chip grid array assembly 1200, formed from the grid array assembly 600, according to a fifth preferred embodiment of the present invention, is shown. The flip-chip grid array assembly 1200 has conductive plating regions that form conductive traces 1220 and a portion of each of the runners 1220 is deposited onto the first portion 610 of each of the solder balls 540. The reminder of each of the runners 1220 is deposited onto the first surface 615 of the electrical insulating material 605. The runners 1220 typically comprise a Nickel and Gold alloy that has been deposited by a dry plating process. Also, the runners 1220 terminate at mounting pads 1225 that are formed from the conductive plating regions which are integral with the runners 1220.

Figure 13:
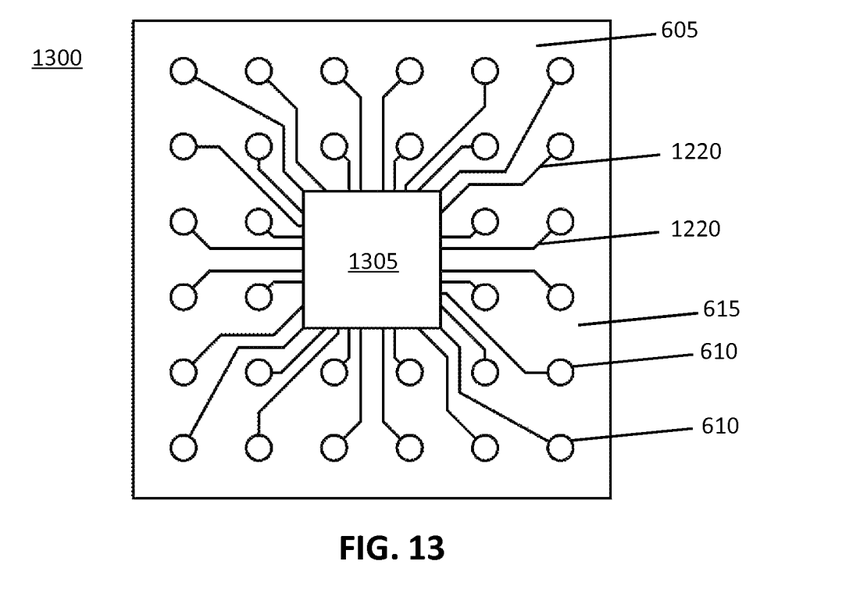
FIG. 13 is a plan view of a semiconductor die assembly, formed from the flip-chip grid array assembly of FIG. 12, according to a fifth preferred embodiment of the present invention.

FIG. 13 is a plan view of a semiconductor die assembly 1300, formed from the flip-chip grid array assembly 1200, according to a fifth preferred embodiment of the present invention. The semiconductor die assembly 1300 includes a semiconductor die 1305 mounted onto the first surface 615 of the electrical insulating material 605. An active surface of the semiconductor die 1305 faces the first surface 615 of the electrical insulating material 605. Also, electrodes of the die 1305 are selectively electrically connected to the solder balls 540 by solder joints between the electrodes and respective aligned mounting pads 1225 of the conductive traces 1220. In this regard, the electrodes are dimensioned and arranged to match the locations of the mounting pads 1225 (and vice versa).

Figure 14:
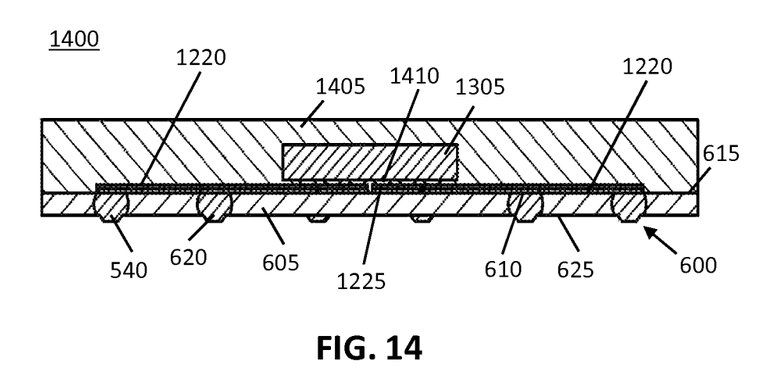
FIG. 14 is a cross-sectional side view of a semiconductor die grid array package, formed from the semiconductor die assembly of FIG. 13, according to a fifth preferred embodiment of the present invention.

FIG. 14 is a cross-sectional side view of a semiconductor die grid array package 1400, formed from the semiconductor die assembly 1300, according to a fifth preferred embodiment of the present invention. The semiconductor die grid array package 1400 includes an encapsulating material 1405 that covers the semiconductor die 1305 and the first surface 615 of the insulating material 605. As will be apparent to a person skilled in the art, the encapsulating material 1045 is typically a mold compound molded to the semiconductor die 1305 and insulating material 605. Also illustrated are the electrodes 1410 of the semiconductor die 1305, these electrode 1410 are soldered to the respective aligned mounting pads 1225 of the conductive traces 1220. This arrangement therefore selectively electrically connects the electrodes 1410 to the solder balls 540. Furthermore, for suitable mounting of the package 1400 to a circuit board, the second portion 620 of each of the solder balls 540 protrude from the second surface 625 of the electrical insulating material 605.

Figure 15:
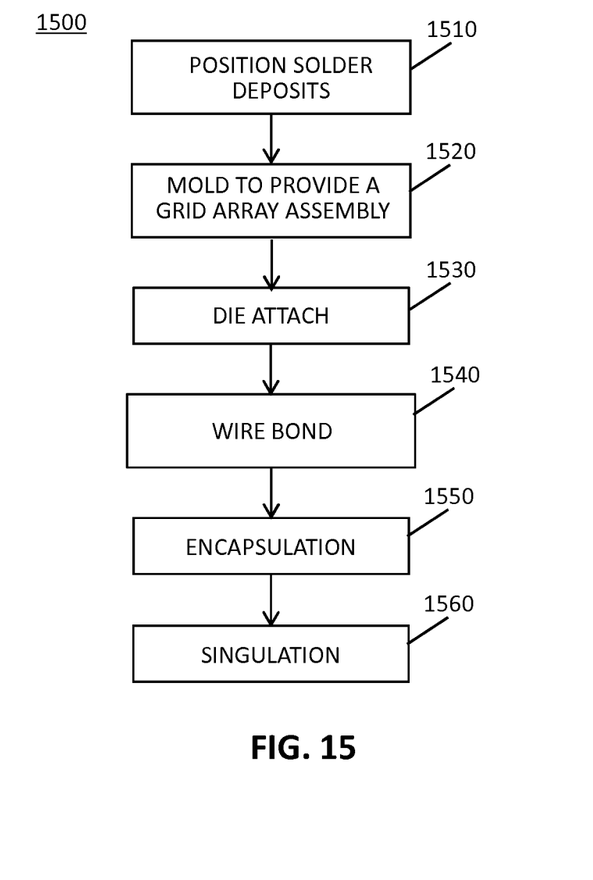
FIG. 15 is a flow chart illustrating a method of manufacturing a semiconductor die grid array package according to the present invention.

FIG. 15 is a flow chart illustrating a method 1500 of manufacturing a semiconductor die grid array package according to the present invention. By way of example only, the method 1500 where appropriate will be described with reference to embodiments of FIGS. 1 to 14. The method 1500 includes, at a block 1510, positioning the solder deposits such as the solder balls 140,540 in the recesses 130,530 of the two-part mold 100,500.

At a block 1520 a molding process is performed after the upper body 105, 505 and lower body 110,510 are brought together to form the molding cavity 115, 515. During the forming of the molding cavity 115, 515 the solder balls 140, 540 are deformed by the compressive force of the mold 100, 500. Once the upper body 105, 505 and lower body 110,510 are brought together, a mold compound is injected or pressed into the molding cavity 115, 515. The mold compound provides the electrical insulating material 205, 605 that is molded around the solder balls 140, 540.

The deforming of the solder balls 140 by the mold 100, during the molding process, results in the first portion 210 protruding from the first surface 215 of the electrical insulating material 205 and the second portion 220 protruding from the second surface 225 of the electrical insulating material 205. Also, the deforming re-shapes the solder balls 140 so that the first portion 210 has a flat bonding surface and the second portion 220 has a flat mounting surface. In contrast the deforming of the solder balls 540 by the mold 500, during the molding process, results in the first portion 610 that that is planar (flush) with the first surface 615 of the electrical insulating material 605 and the second portion 620 that protrudes from the second surface 625 of the electrical insulating material 605. Also, the deforming shapes the solder balls 540 so that the second portion 620 has a flat mounting surface.

After the molding process of block 1520 is completed the grid array assembly 200, 600 is formed and provided to a mounting block 1530. As will be apparent to a person skilled in the art the grid array assemblies 200, 600 can be processed by selectively depositing conductive plating regions onto the first portion of each of the solder balls 140, 540. Also, each of the plating regions may include a conductive trace 1020, 1220 and respective bond pads 1025, 1225 on the first surface of the insulating material.

At the mounting block 1530 the semiconductor die 305, 705 is mounted to the first surface of the insulating material by an epoxy resin. Then, at a block 1540, the electrodes 310, 710, of the die 305, 705 are selectively electrically connected to the solder balls 140, 540. In some embodiments the electrodes 310, 710 are selectively connected to the solder balls 140, 540 by the bond wires 315, 715. Also, in some embodiments the solder balls 140, 540 are doped with a material (such as Bismuth) to increase their hardness. This doping can be useful especially when the bond wires 315, 715 are directly bonded to the solder balls 140, 540. In other embodiments, the selectively electrically connecting is provided by the bond wires being selectively bonded to each of the plating regions such as pads 905, 1025. Also, in further embodiments the active surface of the semiconductor die faces the first surface of the insulating material such provided by the assembly 1300. Thus, the selectively electrically connecting is provided by solder joints between the electrodes 1410 and the respective aligned mounting pads 1225.

At a block 1550 the method 1500 performs covering the semiconductor die 305, 705 and the first surface 215, 615 of the insulating material 205, 605 with an encapsulating material. When the grid array assembly 200, 600 is integral within a large sheet of such assemblies, singulation is performed at a block 1560 to provide the semiconductor die grid array package 400, 800, 900, 1100 or 1400.

Advantageously, the present invention alleviates the need for substrates to be an integral part of a semiconductor die grid array package. Such substrates have runners and with conductive vias to which are mounted protruding solder deposits and therefore add to the thickness of grid array package. Thus the present invention may alleviate manufacturing complexity and potentially reduce package thickness.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of assembling a semiconductor die grid array package, the method comprising:
providing a grid array assembly formed from an electrical insulating material with solder deposits embedded therein, wherein a first portion of each of the solder deposits is exposed on and protrudes from a first surface of the insulating material and a second portion of each of the solder deposits is exposed on an opposite surface of the insulating material;
mounting a semiconductor die to the first surface of the insulating material;
electrically connecting electrodes of the semiconductor die to the solder deposits; and
covering the semiconductor die and the first surface of the insulating material with an encapsulating material.

2. The method of claim 1, wherein providing the grid array assembly includes:
positioning the solder deposits in a mold, wherein the mold includes a first portion with a plurality of recesses, wherein each of the plurality of recesses receives the first portion of each of the solder deposits; and
molding the electrical insulating material around the solder deposits.

3. The method of claim 2, wherein the solder deposits are solder balls.

4. The method of claim 3, further comprising deforming at least one of the first and second portions of the solder deposits.

5. The method of claim 2, wherein the second portion of each of the solder deposits protrudes from the second surface of the insulating material.

6. The method of claim 2, further including selectively depositing conductive plating regions onto the first portion of each of the solder deposits.

7. The method of claim 6, wherein each of the plating regions includes a conductive trace on the first surface of the insulating material.

8. The method of claim 7, wherein electrically connecting the electrodes of the semiconductor die to the solder deposits is provided by bond wires, and wherein the bond wires are selectively bonded to each of said plating regions.

9. The method of claim 7, wherein after mounting is performed, an active surface of the semiconductor die faces the first surface of the insulating material, and the selectively electrically connecting is provided by solder joints between the electrodes and respective aligned mounting pads of the conductive traces.

10. The method of claim 2, wherein electrically connecting the electrodes of the semiconductor die to the solder deposits is provided by bond wires.

11. A semiconductor die grid array package, comprising:
a grid array assembly formed from an electrical insulating material with solder deposits embedded therein, wherein a first portion of each of the solder deposits is exposed on and protrudes from a first surface of the insulating material and a second portion of each of the solder deposits is exposed on an opposite second surface of the insulating material;
a semiconductor die mounted to the first surface of the insulating material, the semiconductor die having a plurality of electrodes that are selectively electrically connected to the solder deposits; and
an encapsulating material covering the semiconductor die and the first surface of the insulating material.

12. The semiconductor die grid array package of claim 11, wherein the electrical insulating material is a mold compound molded around the solder deposits.

13. The semiconductor die grid array package of claim 12, wherein the second portion of each of the solder deposits protrudes from the second surface of the insulating material.

14. The semiconductor die grid array package of claim 12, including conductive plating regions deposited on the first portion of each of the solder deposits.

15. The semiconductor die grid array package of claim 14, wherein each of the plating regions includes a conductive trace on the first surface of the insulating material.

16. The semiconductor die grid array package of claim 15, wherein an active surface of the semiconductor die faces the first surface of the insulating material, and the electrodes are selectively electrically connected to the solder deposits by solder joints between the electrodes and respective aligned mounting pads of the conductive traces.

\* \* \* \* \*